US005491103A

United States Patent [19]
Ahn et al.

[11] Patent Number: 5,491,103
[45] Date of Patent: Feb. 13, 1996

[54] METHOD FOR MANUFACTURING A CAPACITOR STRUCTURE OF A SEMICONDUCTOR MEMORY DEVICE

[75] Inventors: Tae-hyuk Ahn, Ansan; In-ho Nam, Daegu; Joo-young Yoon, Seoul, all of Rep. of Korea

[73] Assignee: Samsung Electronics Co., Ltd., Suwon, Rep. of Korea

[21] Appl. No.: 225,287

[22] Filed: Apr. 8, 1994

[30] Foreign Application Priority Data

Apr. 8, 1993 [KR] Rep. of Korea .................. 93-5901

[51] Int. Cl.⁶ .......................... H01L 21/70; H01L 27/00
[52] U.S. Cl. ...................... 437/52; 437/60; 437/919
[58] Field of Search ........................... 437/47, 52, 60, 437/919; 257/304–308, 311

[56] References Cited

U.S. PATENT DOCUMENTS

5,084,405  1/1992  Fazan et al. .................. 437/52
5,266,512  11/1993  Kirsch ........................... 437/52
5,346,844  9/1994  Cho et al. ....................... 437/52

Primary Examiner—Olik Chaudhuri
Assistant Examiner—H. Jey Tsai
Attorney, Agent, or Firm—Cushman Darby & Cushman

[57] ABSTRACT

A method for manufacturing a capacitor structure of a highly integrated semiconductor memory device. A first conductive layer is formed on a semiconductor substrate, and a first pattern is formed on the first conductive layer. A first material layer is formed on the resultant structure whereon the first pattern is formed, and the first material layer is etched anisotropically, to thereby form a spacer on the side of the first pattern. After etching the first conductive layer using the spacer as an etch-mask, the first pattern is removed. A second conductive layer is formed on the resultant structure and etched anisotropically. The spacer is removed, to thereby form a storage electrode of a capacitor. The distance between neighboring capacitors can be minimized to a value smaller than the limitation imposed by the lithographic technique, to thereby maximize the area of the capacitor.

26 Claims, 11 Drawing Sheets

METHOD FOR MANUFACTURING A CAPACITOR STRUCTURE OF A SEMICONDUCTOR MEMORY DEVICE

BACKGROUND OF THE INVENTION

The present invention relates to a method for manufacturing a highly integrated semiconductor device, and particularly to a method for manufacturing memory cells for DRAMs (dynamic random access memories).

The decrease in cell capacitance accompanying reduction in the memory cell area is a serious hindrance to increasing the packing density of a DRAM, as it causes a degraded read-out capability and an increase in the soft error rate of the memory cell as well as consuming excessive power during low voltage operation by impeding device operation. Thus, increasing the cell capacitance by ensuring adequate unit area is essential along with increasing the packing density.

Generally, in a 256 Mbit DRAM having a 0.25 μm² design rule, when employing a two-dimensional structure staked memory cell, sufficient cell capacitance cannot be obtained even though a high dielectric constant material, e.g., tantalum oxide ($Ta_2O_5$) is used. Therefore, stacked capacitors having a three-dimensional structure have been suggested to increase cell capacitance. The double stack, fin, spread stack, and cylindrical electrode structures are all proposed for a storage electrode having a three-dimensional structure to increase the cell capacitance of a memory cell.

Since both the outer and inner electrode surface can be utilized as an effective capacitor area, the cylindrical structure is favorably adopted as a three-dimensional stacked capacitor, and is suitable for an integrated memory cell circuit which is 64 Mb or higher in capacity. However, the simple cylindrical structure cannot provide sufficient cell capacitance for a highly integrated memory cell which is 256 Mb or higher in capacity. Therefore, various new structures have been suggested to increase cell capacitance by improving the above cylindrical structure.

The CROWN cell structure, suggested by Toru Kaga in 1991, increases the cell capacitance by forming the cylindrical electrode as a crown-shape electrode having a double-wall structure (IEEE Transactions on Electron Device '91, "Crown-Shaped Stacked-Capacitor Cell for 1.5 V Operation 64 Mb DRAMs").

Figure 1:
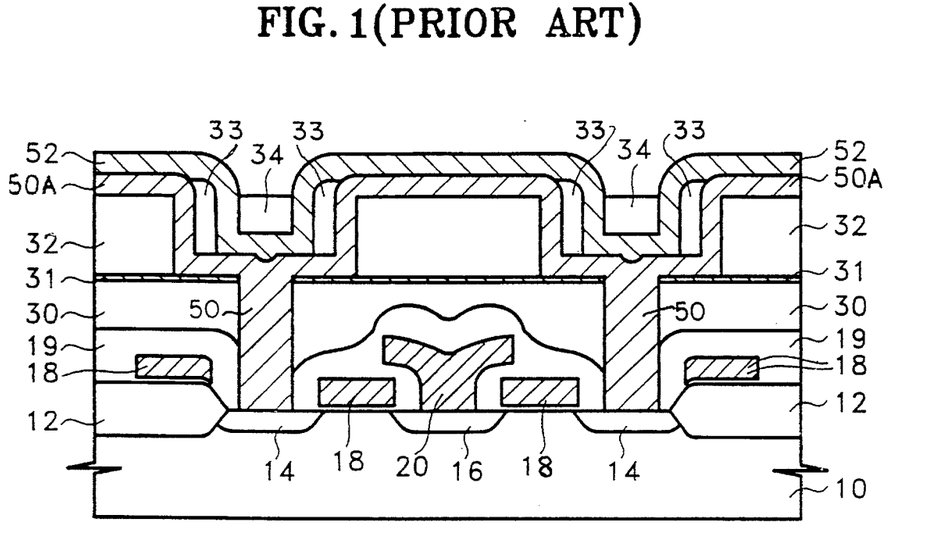
FIGS. 1 through 3 are cross-sectional views for illustrating a conventional method for manufacturing a semiconductor memory device.
Figure 2:
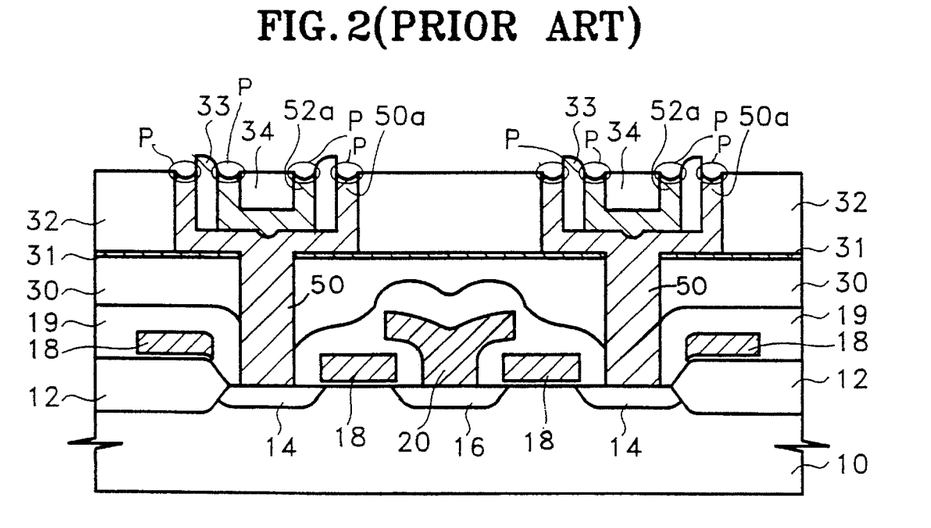
Figure 3:
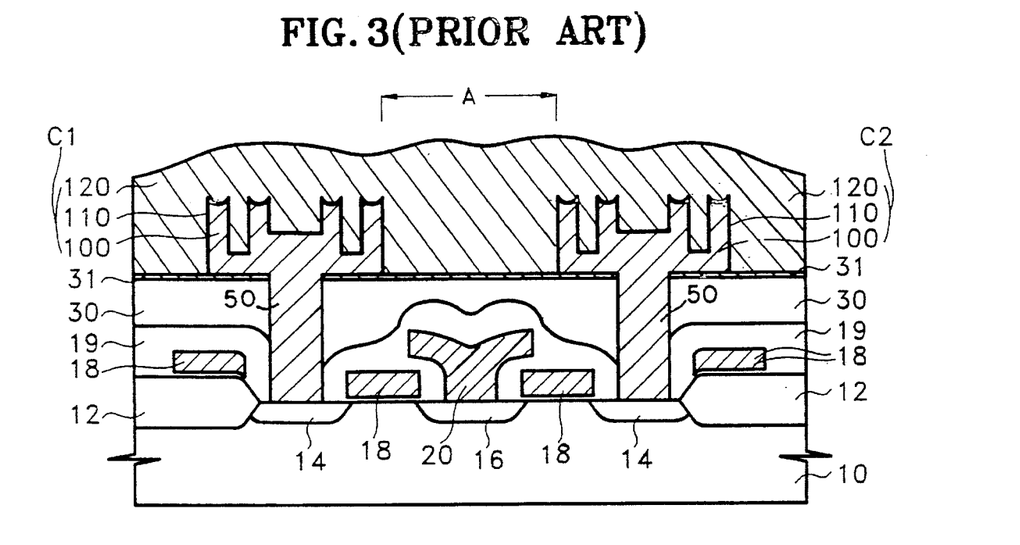

FIGS. 1 through 3 are cross-sectional views for illustrating the method for manufacturing the above-mentioned CROWN cell.

Referring to FIG. 1, a pair of transistors each having a source region 14 and a gate electrode 18, and commonly sharing a drain region 16 and a bit line 20 in contact with drain region 16 are formed on an active region of a semiconductor substrate 10 which is divided into active and isolation regions by a field oxide 12. Then, an insulating layer 19 is formed on the entire surface of the resultant structure for insulating the transistor. After forming a planarizing layer 30 for planarizing the surface of substrate 10, an etch-blocking layer 31, e.g., a silicon nitride ($Si_3N_4$) layer is formed on planarizing layer 30. Then, etch-blocking layer 31, planarizing layer 30, and insulating layer 19 are partially etched, thereby forming a contact hole for connecting a storage electrode of a capacitor to source region 14. Thereafter, a conductive material, e.g., an impurity-doped polysilicon is deposited and etched back, to thereby form a bottom electrode 50. Then, an oxide, e.g., a silicon dioxide ($SiO_2$) is thickly deposited and patterned to form an oxide film groove 32. Thereafter, a conductive material, e.g., an impurity-doped polysilicon is deposited, to thereby form a first conductive layer 50A which is connected with bottom electrode 50. Then, an oxide, e.g., a silicon dioxide for forming a cylindrical electrode portion of the storage electrode is deposited and etched anisotropically, to thereby form an oxide film spacer 33 on a side of first conductive layer 50A. After depositing a conductive material, e.g., an impurity-doped polysilicon to form a second conductive layer 52, an oxide, e.g., a silicon dioxide is deposited and etched back, thereby filling the oxide 34 the within oxide film groove 32. Here, due to the presence of oxide 34, second conductive layer 52 is prevented from being removed during a subsequent etching process.

Referring to FIG. 2, first and second conductive layers 50A and 52, which exist in the portions except in the interior of oxide film groove 32, are etched back to form cylindrical electrodes 50a and 52a isolated from each other. Here, because cylindrical electrodes 50a and 52a are formed by etching first and second conductive layers 50A and 52 which exist between oxide film groove 32, oxide film spacer 33, and oxide 34, are formed with sharp portions P at the top edges of the cylindrical electrodes. Sharp portions P cause leakage currents and the breakdown of the dielectric layer, and thus degrade the reliability of the device.

Referring to FIG. 3, the oxide film groove 32, oxide film spacer 33 and oxide 34 are all removed by a wet etching process using etch-blocking layer 31 as an etch-end point, so that a storage electrode 100 composed of bottom portion 50 and cylindrical portions 50a and 52a is formed. Thereafter, a dielectric layer 110 is formed over the entire surface of storage electrode 100, and a conductive material, e.g., an impurity-doped polysilicon is deposited to form a plate electrode 120. As a result, capacitors C1 and C2 each composed of storage electrode 100, dielectric layer 110, and plate electrode 120 are completed.

In the highly integrated memory cell, the distance between neighboring capacitors must be reduced so as to necessitate an increase in cell capacitance by maximizing the area of capacitor. According to the above-described conventional method, since the distance between neighboring capacitors (refer to A in FIG. 3) is determined by the pattern size of the photoresist, it cannot be minimized to a value smaller than the limitation imposed by the lithographic technique employed. Therefore, the capacitor area cannot be maximized, and thus the desired cell capacitance cannot be obtained.

A capacitor which is disclosed in European Patent Publication No. 404,553 A1, is manufactured so as to overcome the above-described problem. The method for manufacturing the above-mentioned capacitor will be explained with reference to FIG. 4 and FIG. 5.

Figure 4:
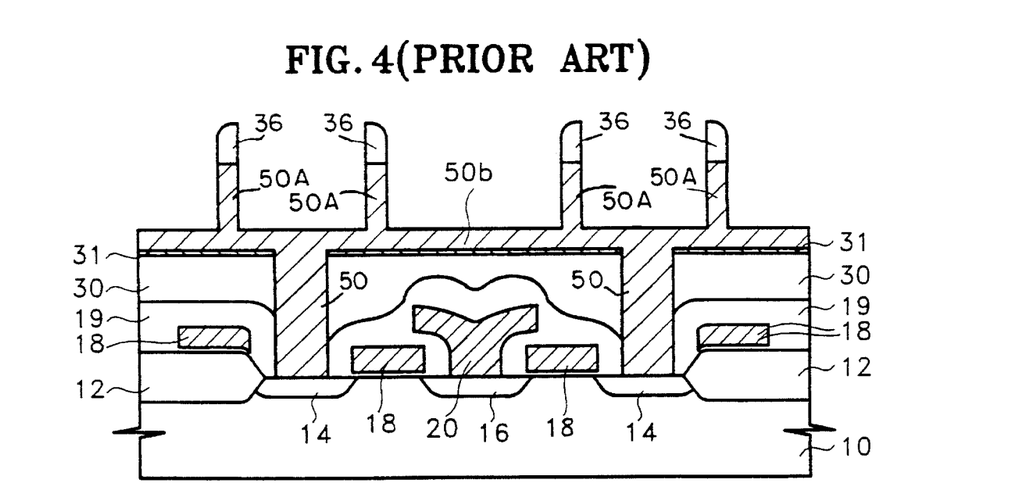
FIGS. 4 and 5 are cross-sectional views for illustrating a method for manufacturing a semiconductor memory device as disclosed in European Patent Publication No. 404,553 A1.

Referring to FIG. 4, after forming the contact hole which exposes source region 14 of the transistor by the method as already described with reference to FIG. 1, a conductive material, e.g., an impurity-doped polysilicon is deposited to a constant thickness on the base of etch-blocking layer 31 and fills the contact hole completely, to thereby form a first conductive layer 50. Thereafter, for example, a phosphor-silicate glass (PSG) film is coated on the entire surface of the resultant structure and etched anisotropically, to thereby form a first oxide film spacer 36 on the side of the PSG film pattern. Then, the PSG film pattern is removed, and first conductive layer 50 is etched to a predetermined depth, using first oxide film spacer 36 as an etch-mask. Thus, a thin conductive film 50b and cup-shaped electrode 50a are formed.

Figure 5:
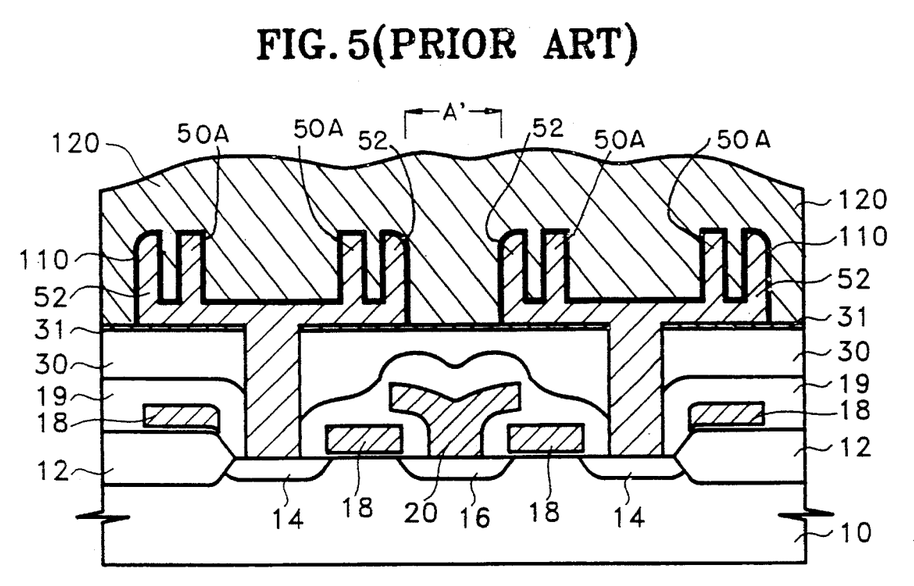

Referring to FIG. 5, an oxide, e.g., a silicon dioxide is deposited on the entire surface of the resultant structure and etched anisotropically, to thereby form a second oxide film spacer (not shown). Then, a conductive material, e.g., an impurity-doped polysilicon is deposited to form a second conductive layer (not shown), and the second conductive layer and first conductive layer are etched anisotropically, using etch-blocking layer 31 as an etch end-point. As a result, cup-shaped principle electrode 50a, ring-shaped peripheral electrode 52 and bottom electrode 50 which connects principle electrode 50a with peripheral electrode 52 are formed. Thereafter, a dielectric film 110 is formed by coating a high dielectric material on the entire surface of the resultant structure, and a plate electrode 120 is formed by depositing a conductive material, e.g., an impurity-doped polysilicon, so that a capacitor composed of storage electrode 100, dielectric film 110 and plate electrode 120 is completed.

According to the conventional method described above, since the peripheral electrode 52 is formed in self-aligned fashion with the principle electrode 50a, the distance between neighboring capacitors (refer to A' in FIG. 5) can be minimized to a value smaller than the limitation imposed by the lithographic technique, thereby maximizing the area of the capacitor. On the other hand, it is difficult to form the thin conductive film (refer to 50b in FIG. 4) connecting peripheral electrode 52 with principle electrode 50a. The thin conductive film 50b is formed by etching the first conductive layer (refer to 50 in FIG. 4) to a predetermined depth. Since it is impossible to detect an etch end-point during the above etching process, the stability of the process cannot be assured.

SUMMARY OF THE INVENTION

It is an object of the present invention to provide a method for manufacturing a highly integrated semiconductor memory device having a high charge storage capacitance.

It is another object of the present invention to provide a method for manufacturing a highly integrated semiconductor memory device and for manufacturing a reliable capacitor thereof.

To accomplish the above objects, there is provided a method for manufacturing a semiconductor memory device comprising the steps of:

forming a first conductive layer on a semiconductor substrate;

forming a first pattern on the first conductive layer;

forming a first material layer on the resultant structure whereon the first pattern is formed;

etching the first material layer anisotropically to thereby form a spacer on the side of the first pattern;

etching the first conductive layer using the spacer as an etch-mask;

removing the first pattern;

forming a second conductive layer on the resultant structure;

etching the second conductive layer anisotropically; and removing the spacer to thereby form a storage electrode of a capacitor.

Also, to accomplish the above objects, there is provided a method for manufacturing a semiconductor memory device comprising the steps of:

forming a first conductive layer on a semiconductor substrate;

forming a first material layer and a second material layer sequentially on the first conductive layer;

patterning the second material layer to thereby form a first pattern;

forming a third material layer on the resultant structure whereon the first pattern is formed;

etching the third material layer anisotropically to thereby form a spacer on the side of the first pattern, and etching the first material layer simultaneously;

etching the first conductive layer using the spacer as an etch-mask;

removing the first pattern and first material layer;

forming a second conductive layer on the resultant structure;

etching the second conductive layer anisotropically; and removing the spacer to thereby form a storage electrode of a capacitor.

According to the present invention, the distance between neighboring capacitors can be minimized to a value smaller than the limitation imposed by the lithographic technique.

BRIEF DESCRIPTION OF THE DRAWINGS

The above objects and other advantages of the present invention will become more apparent by describing in detail a preferred embodiment thereof with reference to the attached drawings in which.

DETAILED DESCRIPTION OF THE INVENTION

The present invention will be explained in more detail with reference to the attached drawings.

Figure 6:
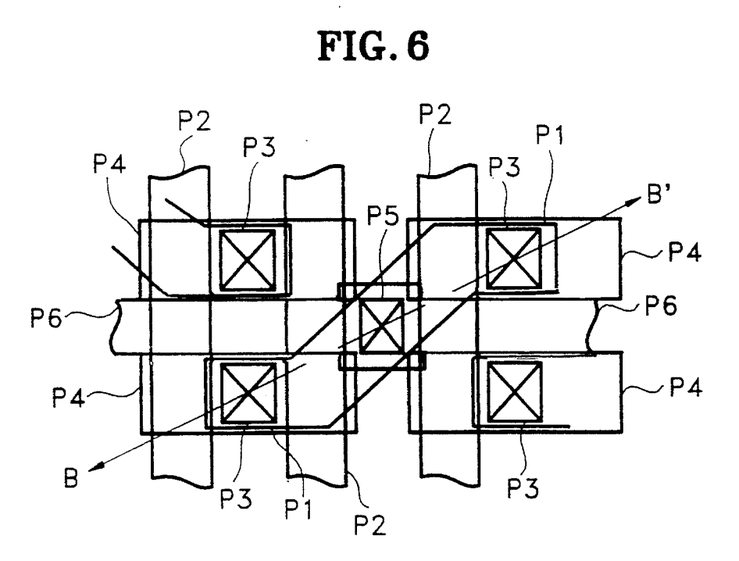
FIG. 6 is a layout diagram for illustrating a method for manufacturing a semiconductor memory device according to the present invention.

FIG. 6 is a layout diagram for illustrating a method for manufacturing a semiconductor memory device according to the present invention.

Referring to FIG. 6, P1 indicates a mask pattern for forming a field oxide dividing a semiconductor substrate into an active region and an isolation region, and P2 indicates a mask pattern for forming a gate electrode of a transistor. P3 indicates a mask pattern for forming a contact hole connecting a capacitor storage electrode to the source region of a transistor, and P4 indicates a mask pattern for forming the capacitor storage electrode. P5 indicates a mask pattern for forming a contact hole connecting a bit line to a drain region of the transistor, and P6 indicates a mask pattern for forming the bit line.

Figure 7:
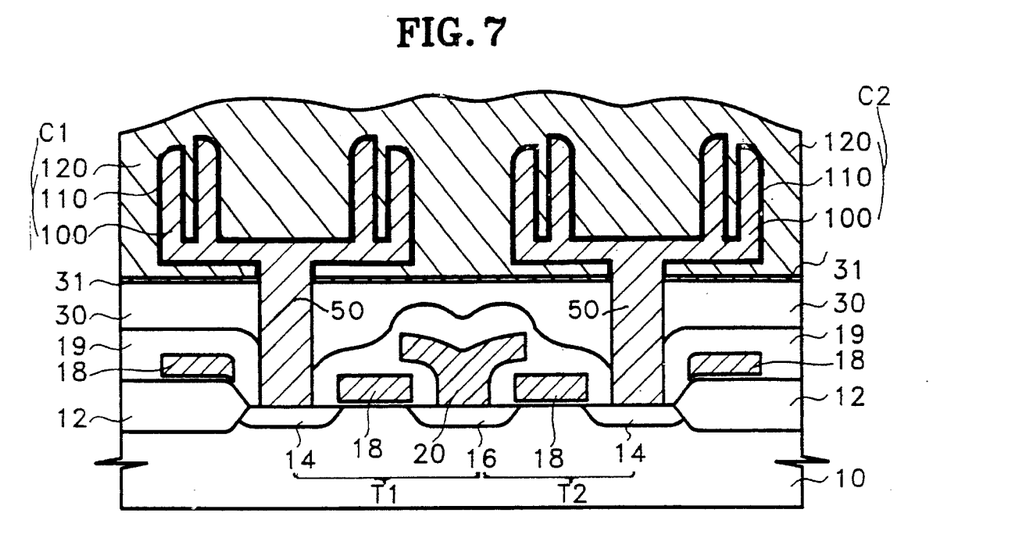
FIG. 7 is a cross-sectional view for illustrating a method for manufacturing a semiconductor memory device according to the present invention, taken along line B—B' in FIG. 6.

FIG. 7 is a cross-sectional view for illustrating a method for manufacturing a semiconductor memory device according to the present invention, taken along line B—B' in FIG. 6.

Referring to FIG. 7, a pair of transistors T1 and T2 each having a source region 14 and a gate electrode 18, and commonly sharing a drain region 16 are formed on an active region formed between field oxides 12 in a semiconductor substrate 10. Here, each gate electrode 18 serves as a word line, and a bit line 20 is connected to drain region 16. Storage electrodes 100 are connected respectively to each of source regions 14, and a dielectric film 110 and a plate electrode 120 are formed sequentially on each storage electrode 100, thereby forming capacitors C1 and C2.

FIGS. 8 through 12 are cross-sectional views for illustrating a method for manufacturing a semiconductor memory device according to a first embodiment of the present invention.

Figure 8:
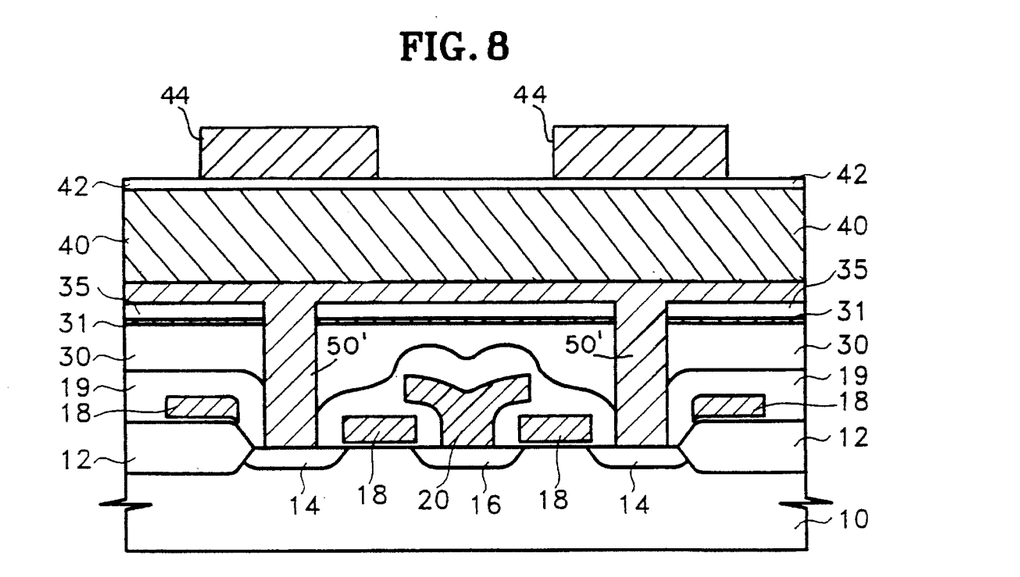
FIGS. 8 through 12 are cross-sectional views for illustrating a method for manufacturing a semiconductor memory device according to a first embodiment of the present invention.

FIG. 8 shows the steps of forming a first conductive layer 50' on a semiconductor substrate 10 whereon a pair of transistors have been formed. A pair of transistors each having a source region 14 and a gate electrode 18, and commonly sharing a drain region 16 and a bit line 20 in connection with drain region 16 are formed on an active region of semiconductor substrate 10 which is divided into active and isolation regions by a field oxide 12. Then, an insulating layer 19 is formed on the entire surface of the resultant structure for insulating the transistors. After forming a planarizing layer 30 for planarizing the surface of substrate 10 whose surface has become stepped as a result of the transistor formation step, a material, e.g., a silicon nitride ($Si_3N_4$) is deposited to a thickness of 50~300 Å on planarizing layer 30, to thereby form an etch-blocking layer 31. Successively, a material, e.g., an oxide is deposited to a thickness of 500~2,000 Å, to thereby form a sacrificial layer 35.

Then, sacrificial layer 35, etch-blocking layer 31, planarizing layer 30 and insulating layer 19 are partially etched using mask pattern P3 in FIG. 6, to thereby form a contact hole (not shown) for connecting a storage electrode of a capacitor to each source region 14.

Thereafter, a conductive material, e.g., an impurity-doped polysilicon, whose etch rate is different from that of the material constituting sacrificial layer 35 (for example, when the etch rate of a "B" material is over 4 providing that the etch rate of an "A" material is set to 1, it can be expressed that the "A" material has a different etch rate from that of the "B" material with respect to any etching process) is deposited to a thickness of 500~1,500 Å on the entire surface of the resultant structure, thereby forming first conductive layer 50'.

Then, after coating a lower-resist 40, intermediate oxide 42, and upper-resist 44 sequentially on first conductive layer 50' using a multi-layer resist (MLR) lithographic technique, upper-resist 44 is patterned using mask pattern P4 in FIG. 6 for forming each storage electrode.

Figure 9:
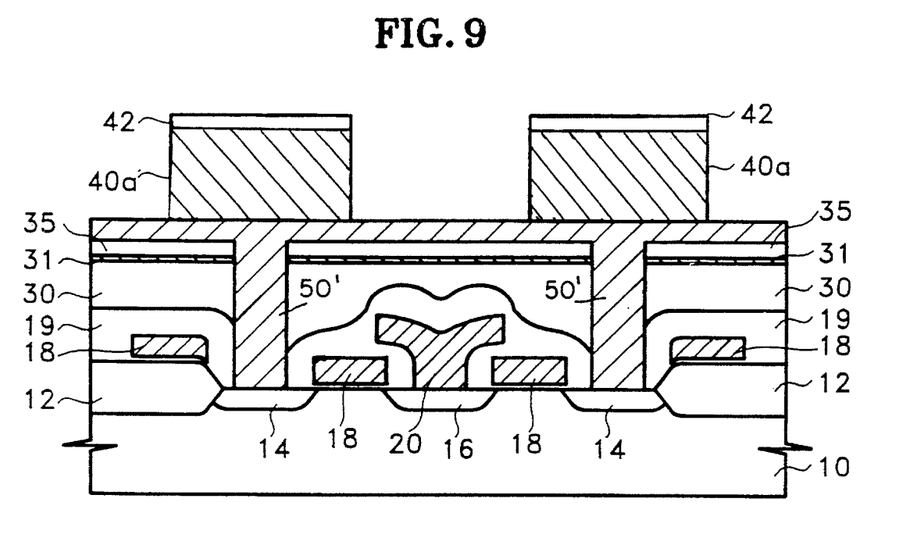

FIG. 9 shows a step of forming a first pattern 40a. Intermediate oxide film 42 is etched anisotropically using the patterned upper-resist 44 as an etch-mask, and successively, lower-resist 40 is etched according to a reactive ion etching process, to thereby form first pattern 40a for forming the cylindrical electrode of each storage electrode.

Here, it is desired that the material constituting first pattern 40a has an etch rate different from that of first conductive layer 50' with respect to any anisotropic etching or isotropic etching process. As described above, first pattern 40a is formed using an MLR technique in the present invention.

Figure 10:
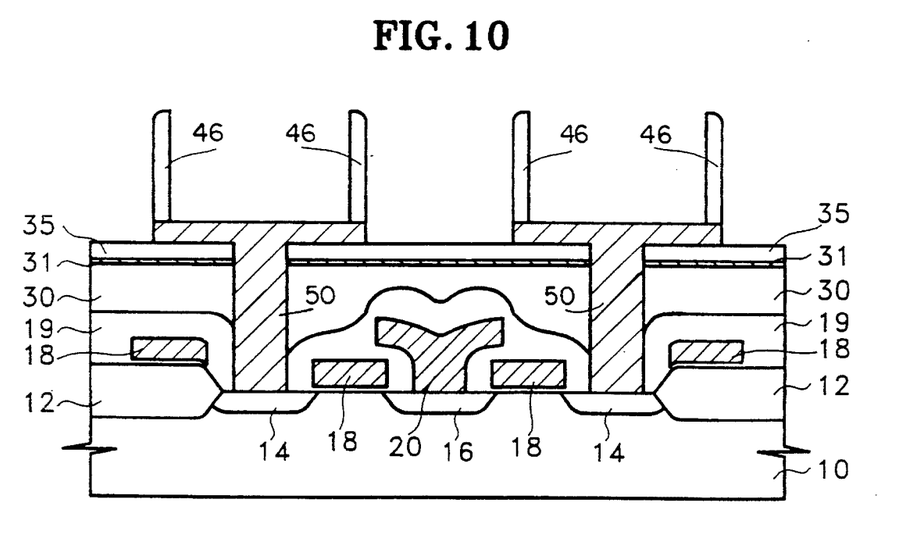

FIG. 10 shows a step of forming a spacer 46 and a bottom electrode 50. After removing intermediate oxide film 42 by a wet etching process, a material, which has a different etch rate from that of the material constituting first conductive layer 50' and which has the same or a similar etch rate as that of the material constituting sacrificial layer 35 with respect to any anisotropic etching or isotropic etching process, e.g., a low temperature oxide (LTO) forming at a temperature below 200° C. is deposited, to thereby form a first material layer (not shown).

Here, the reason why the LTO film is formed at a temperature below 200° C. is that a deformation of first pattern 40a, composed of a photoresist, which could occur at a temperature for depositing an oxide must be prevented. Also, since the heat-treatment time is shortened using the LTO film, it is advantageous to form a shallow junction of a transistor, and thus the electrical characteristics of the transistors are enhanced.

Thereafter, the first material layer is etched back by an anisotropic etching process, to thereby form spacer 46 composed of the remaining first material layer on the sides of first pattern 40a. Then, first conductive layer 50' is etched by performing an anisotropic etching process, using spacer 46 as an etch-mask and sacrificial layer 35 as an etch end-point, thereby forming each bottom electrode portion 50 of the storage electrodes.

Figure 11:
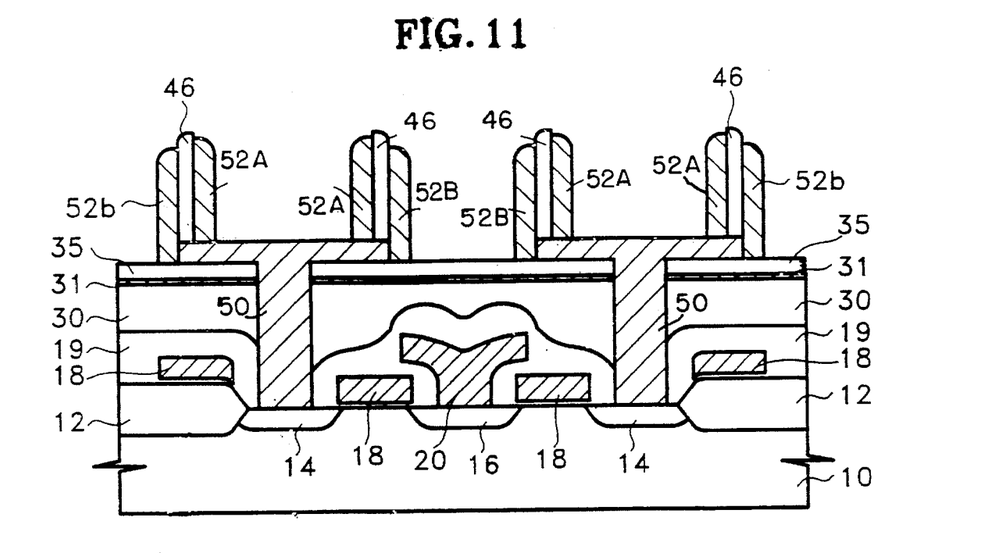

FIG. 11 shows a step of forming the cylindrical electrodes 52a and 52b of each storage electrode. A material, which has a different etch rate from that of the material constituting spacer 46 and the same or a similar etch rate as that of the material constituting bottom electrode 50 with respect to any anisotropic etching or isotropic etching process, e.g., an impurity-doped polysilicon is deposited to a thickness of 500~1,500 Å on the entire surface of the resultant structure wherein bottom electrode 50 is formed, to thereby form a second conductive layer (not shown). Thereafter, the second conductive layer is etched back according to an anisotropic etching process, thereby forming cylindrical electrodes 52a and 52b composed of the second conductive layer material on the sides of each spacer 46.

According to the present invention, since cylindrical electrodes 52a and 52b are formed by etching back the second conductive layer on the base of spacer 46, the tops of cylindrical electrodes 52a and 52b do not have sharp portions and are formed as gently rounded structure, so that the reliability of the capacitor is enhanced. Also, when etching the second conductive layer for forming cylindrical electrodes 52a and 52b, stability of the etching-process is secured because sacrificial layer 35 having a different etch rate from that of the second conductive layer is used as an etch end-point.

Figure 12:
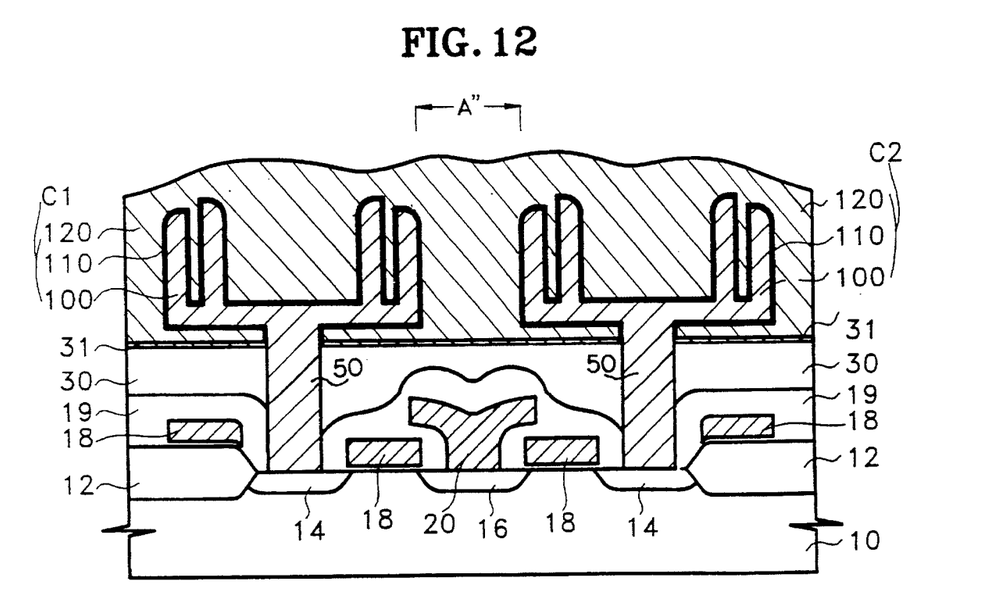

FIG. 12 shows a step of forming capacitors C1 and C2. Spacers 46 and sacrificial layer 35 are removed by a wet etching process, to thereby form each storage electrode 100 composed of a double cylindrical electrode 52a and 52b and bottom electrode 50. Here, sacrificial layer 35 and spacer 46 have the same or a similar etch rate with each other with respect to any wet etching process, and thus, they are removed together by a single wet etching process.

Thereafter, a high dielectric material, e.g., an ONO (oxide/nitride/oxide) or tantalum oxide ($Ta_2O_5$) is deposited onto the entire surface of each storage electrode 100 to form a dielectric film 110, and a conductive materials e.g., an impurity-doped polysilicon is deposited on dielectric film 100 to form each plate electrode 120. As a result, capacitors C1 and C2 each composed of storage electrode 100, dielectric film 110 and plate electrode 120 are completed.

Here, sacrificial layer 35 has been provided to permit use of the lower surface of storage electrode 100 as an effective capacitor area for increasing the cell capacitance, and etch-blocking layer 31 has been provided to prevent gate electrode 18 and bit line 20 from being damaged by the wet etching process employed for removing sacrificial layer 35.

According to the first embodiment described above, an outer cylindrical electrode (refer to 52b in FIG. 11) is formed in self-aligned fashion with the internal cylindrical electrode (refer to 52a in FIG. 11) which is determined by the size of the actual mask pattern employed for forming each storage electrode 100, so that the pattern size of each storage electrode is increased to 0.1–0.3 µm along the lateral direction. Therefore, the distance between neighboring capacitors (refer to A" in FIG. 12) can be minimized to a value smaller than the limitation imposed by the lithographic technique, thereby maximizing the area of each capacitor. Also, since the height of the cylindrical electrode is controlled in accordance with the thickness of first pattern (refer to FIG. 9), the effective capacitor area is increased easily in the vertical direction.

FIGS. 13 through 17 are cross-sectional views for illustrating a method for manufacturing a semiconductor memory device according to a second embodiment of the present invention.

Figure 13:
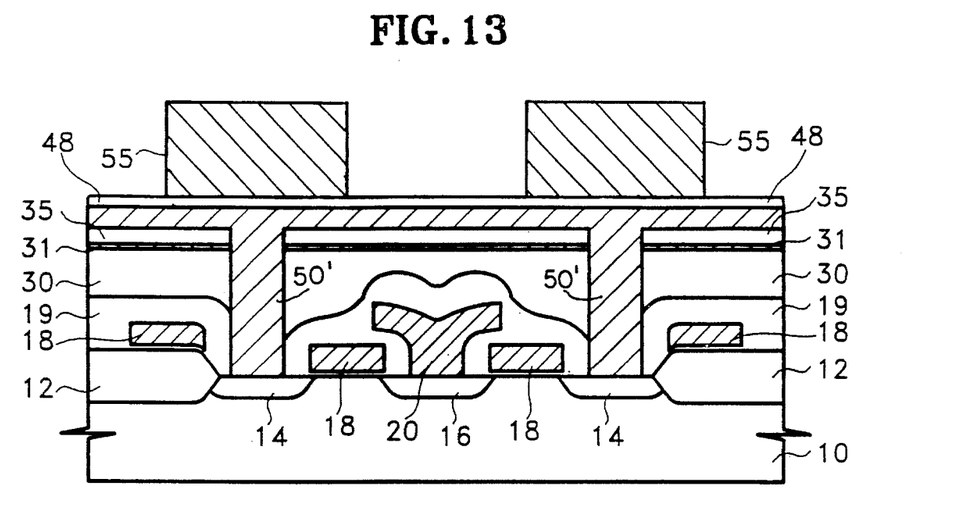
FIGS. 13 through 17 are cross-sectional views for illustrating a method for manufacturing a semiconductor memory device according to a second embodiment of the present invention.

Referring to FIG. 13, after forming a contact hole exposing source region 14 of each transistor by the method described with reference to FIG. 8, a conductive material, e.g., an impurity-doped polysilicon is deposited to form a first conductive layer 50'. Thereafter, for example, an oxide and a polysilicon are deposited sequentially on first conductive layer 50' to thereby form a first material layer 48 and a second material layer (not shown).

Here, a material, which has a different etch rate from that of the material constituting first conductive layer 50' with respect to any anisotropic etching process, is used as the material constituting first material layer 48. It is desirable that a material, which has a different etch rate from that of the material constituting first material layer 48 and the same or a similar etch rate as that of the material constituting first conductive layer 50', is used as the material constituting the second material layer. As described above, an oxide is used as first material layer 48 and a polysilicon is used as the second material layer in the present invention.

Then, the second material layer is patterned using mask pattern P4 in FIG. 6 for forming each storage electrode, to thereby form a first pattern 55 for forming the cylindrical electrode of each storage electrode.

Figure 14:
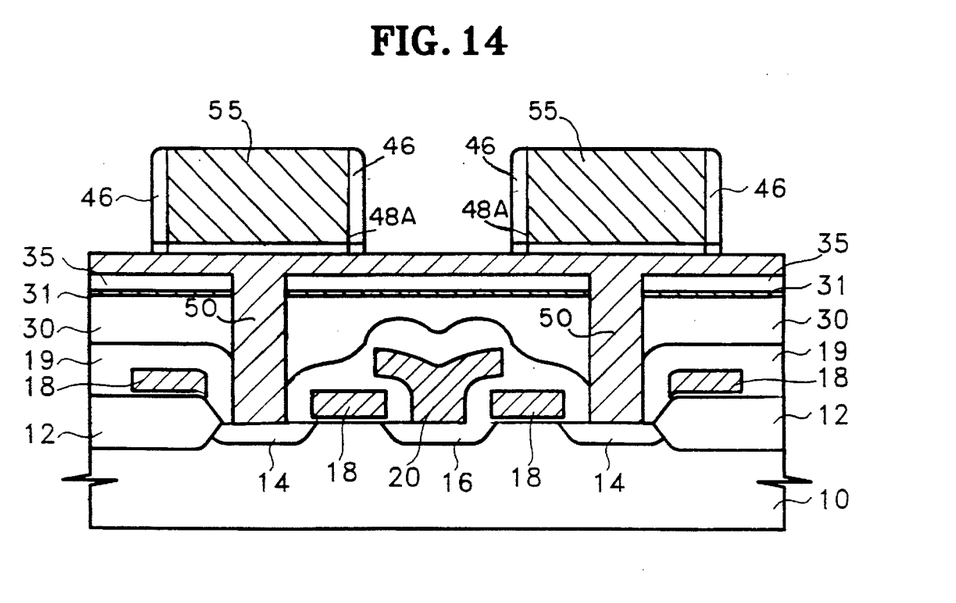

Referring to FIG. 14, a material, which has a different etch rate from that of the material constituting first pattern 55 and the same or a similar etch rate as that of the material constituting first material layer 48 with respect to any anisotropic etching process, e.g., a low temperature oxide (LTO) is deposited on the entire surface of the resultant structure, thereby forming a third material layer (not shown). Thereafter, the third material layer is etched back by an anisotropic etching process, to thereby form a spacer 46 composed of the third material layer on the side of first pattern 55.

Here, since first material layer 48 has a different etch rate from that of the third material layer with respect to the above described anisotropic etching process, all portions of first material layer 48 except for the bottom portion 48a underlying first pattern 55 are removed together when forming spacer 46.

Figure 15:
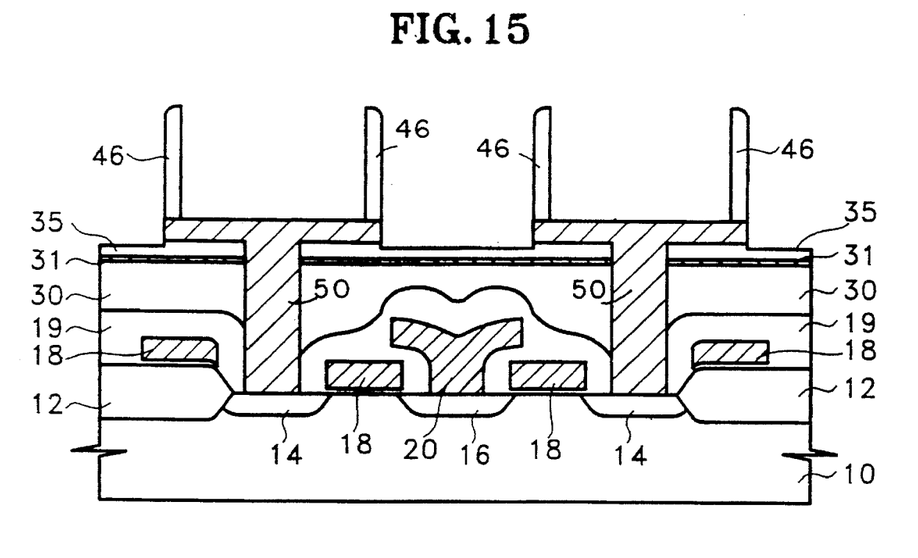

Referring to FIG. 15, first conductive layer 50' is etched by performing an anisotropic etching process, using spacer 46 as an etch-mask and sacrificial layer 35 as an etch-end point, to thereby form the bottom electrode 50 of each storage electrode. At this time, first pattern 55 is also removed because the material constituting first pattern 55 has the same or a similar etch rate as that of the material constituting first conductive layer 50' with respect to any anisotropic etching process.

Thereafter, the remnant of first material layer 48a, which existed below the bottom portion of first pattern 55, is removed. Here, sacrificial layer 35 is partially etched, since the material constituting sacrificial layer 35 has the same or a similar etch rate as that of the material constituting first material layer 48a with respect to any anisotropic etching process.

Figure 16:
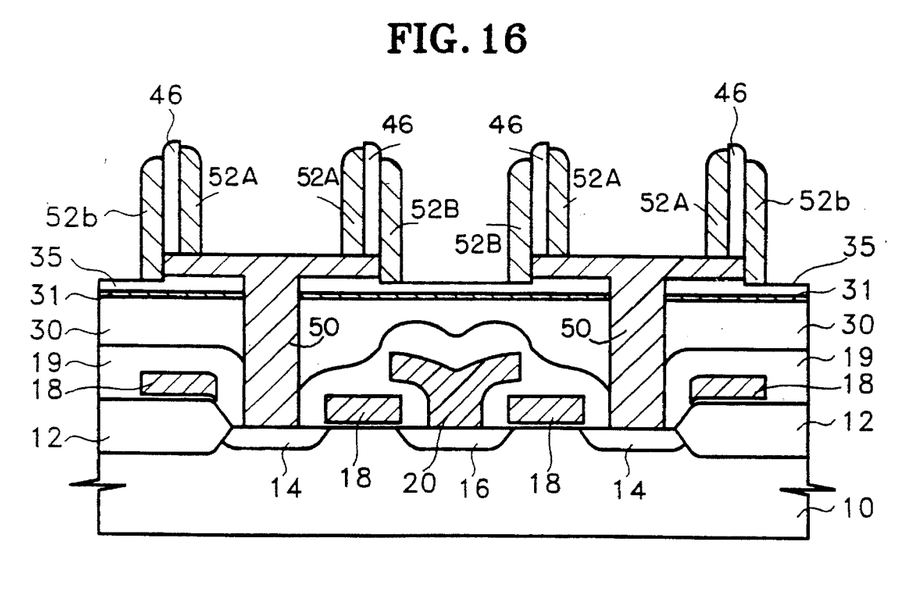

Referring to FIG. 16, a conductive material, which has a different etch rate from that of the material constituting spacer 46 with respect to any anisotropic etching process, e.g., an impurity-doped polysilicon is deposited on the entire surface of the resultant structure, to thereby form a second conductive layer (not shown). Thereafter, the second conductive layer is etched back by an anisotropic etching process, to thereby form cylindrical electrodes 52a and 52b composed of the second conductive layer on the sides of spacer 46.

Figure 17:
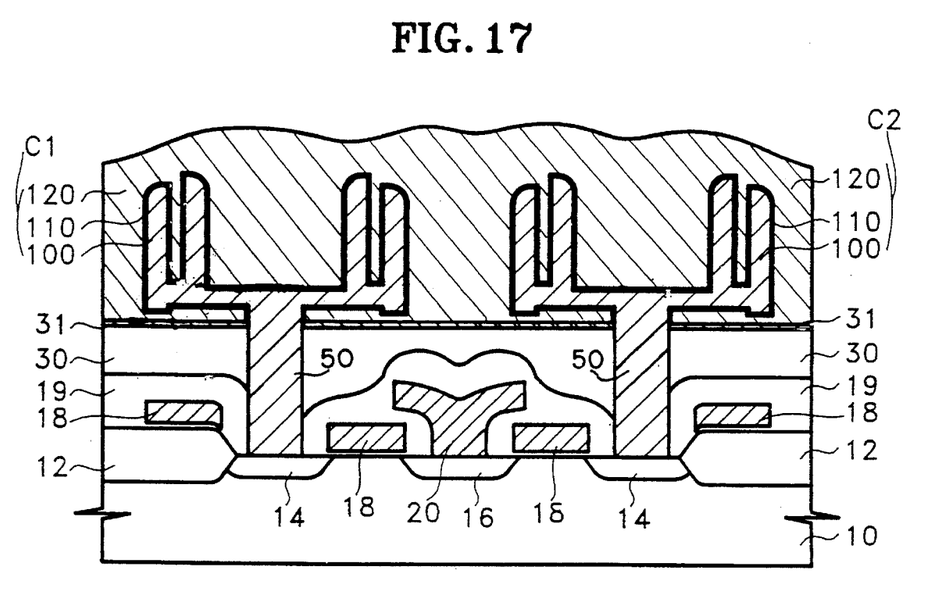

Referring to FIG. 17, spacer 46 and sacrificial layer 35 are removed by a wet etching process, to thereby form a storage electrode 100 composed of double cylindrical electrodes 52a and 52b and bottom electrode 50. Thereafter, a dielectric film 110 is formed on the entire surface of each storage electrode 100, and then, a conductive material, e.g., an impurity-doped polysilicon is deposited on the entire surface of dielectric film 110, to thereby form a plate electrode 120.

According to the second embodiment described above, since an oxide is used as the first material layer and third material layer and a polysilicon is used as the first and second conductive layers and second material layer, the manufacturing process is easily accomplished without the complexity of selecting the film employed.

FIGS. 18 through 21 are cross-sectional views for illustrating a method for manufacturing a semiconductor memory device according to a third embodiment of the present invention.

Figure 18:
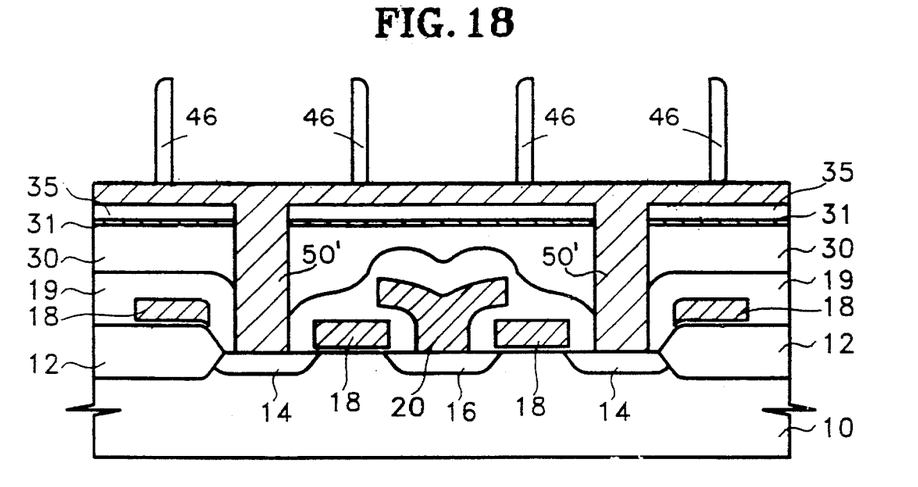
FIGS. 18 through 21 are cross-sectional views for illustrating a method for manufacturing a semiconductor memory device according to a third embodiment of the present invention.

FIG. 18 shows a step of forming a first spacer 46. A first pattern (not shown) is formed on first conductive layer 50' by the method already described with reference to the first or second embodiment. After forming first spacer 46 composed of a first material layer on the side of the first pattern, the first pattern is removed.

Figure 19:
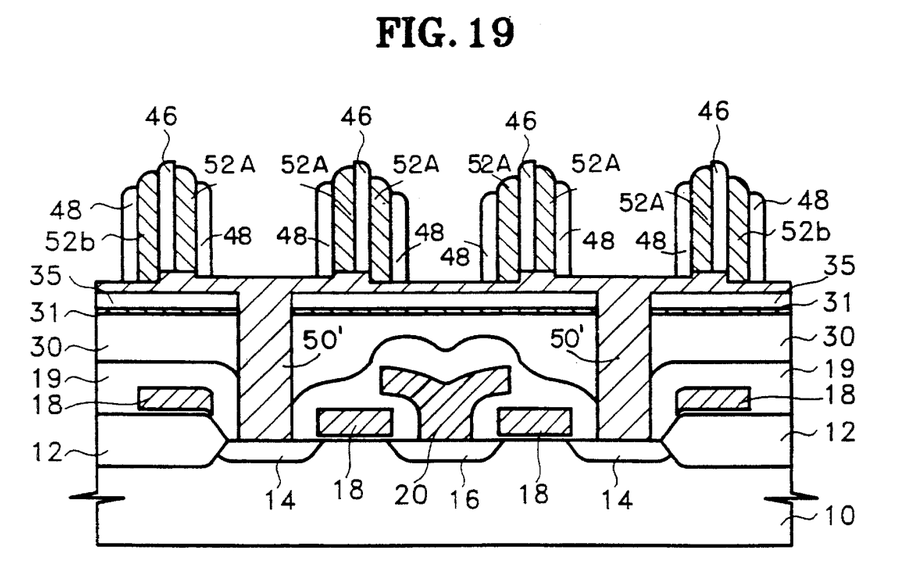

FIG. 19 shows a step of forming first cylindrical electrodes 52a and 52b and a second spacer 48. After depositing a conductive material, e.g., an impurity-doped polysilicon on the entire surface of the resultant structure to form a second conductive layer (not shown), the second conductive layer is etched back according to an anisotropic etching process, to thereby form first cylindrical electrodes 52a and 52b, composed of the second conductive layer, on the side of spacer 46.

Thereafter, a material, which has a different etch rate from that of the material constituting first cylindrical electrodes 52a and 52b and the same or a similar etch rate as that of the material constituting first spacer 46 with respect to any anisotropic etching process, e.g., an oxide is deposited to form a second material layer (not shown). Then, the second material layer is etched back according to an anisotropic etching process, to thereby form second spacers 48 composed of the second material layer on the sides of first cylindrical electrodes 52a and 52b.

Figure 20:
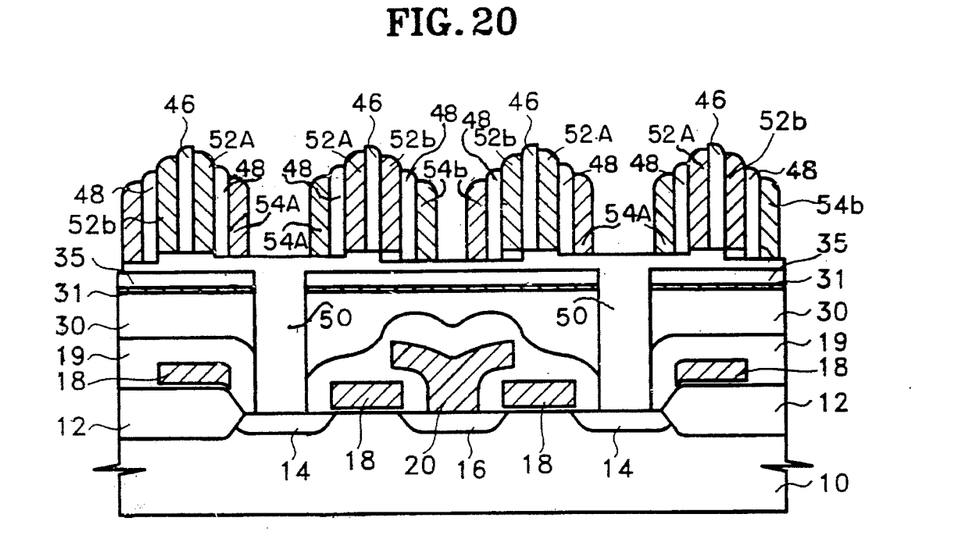

FIG. 20 shows a step of forming second cylindrical electrodes 54a and 54b and a bottom electrode 50. A material, which has a different etch rate from that of the material constituting second spacers 48 and the same or a similar etch rate as that of the material constituting first cylindrical electrodes 52a and 52b with respect to any anisotropic or isotropic etching process, e.g., an impurity-doped polysilicon is deposited to form a third conductive layer (not shown). Thereafter, the third conductive layer is etched back according to an anisotropic etching process, to thereby form second cylindrical electrodes 54a and 54b composed of the third conductive layer on the sides of second spacers 48. At this time, first conductive layer 50' is also etched, thereby forming bottom electrode portion 50 of each storage electrode.

Figure 21:
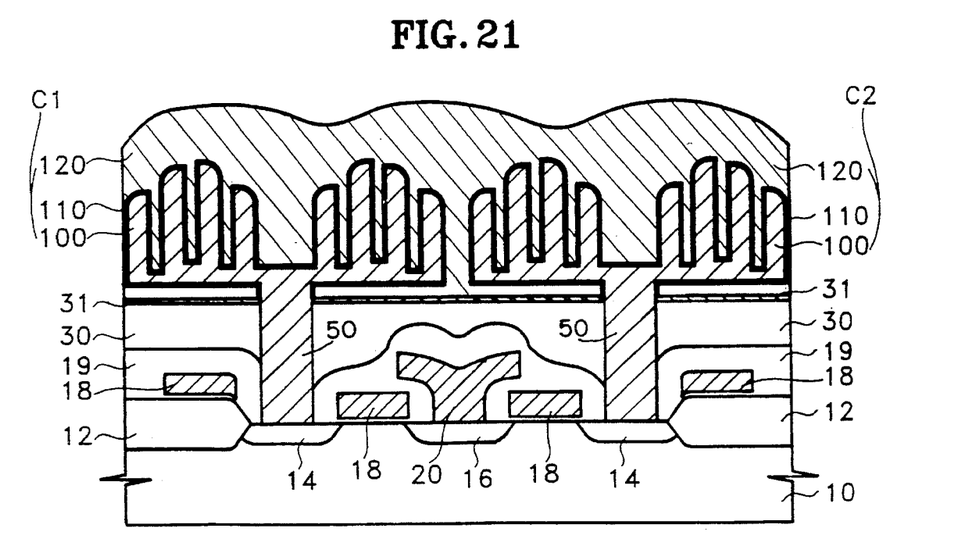

FIG. 21 shows a step of forming capacitors C1 and C2. First spacers 46, second spacers 48, and sacrificial layer 35 are removed by a wet etching process, to thereby form storage electrodes 100 each composed of quadruple cylindrical electrodes 52a, 52b, 54a, and 54b and a bottom electrode 50. Thereafter, a dielectric film 110 and a plate electrode 120 are formed sequentially on the entire surface of each storage electrode 100, to thereby complete capacitors C1 and C2.

According to the third embodiment described above, the process for forming the spacers and cylindrical electrodes is performed once or more, so that the cylindrical electrodes can be formed in quadruple while the distance between neighboring capacitors is minimized,. Therefore, the cell capacitance is enhanced in an easy process.

According to the present invention as described above, an internal cylindrical electrode is formed by a real mask pattern for forming a storage electrode, and then, an outer cylindrical electrode is formed in self-aligned fashion with the internal cylindrical electrode. Therefore, the distance between neighboring capacitors can be minimized to a value smaller than the limitation imposed by the lithographic technique, thereby maximizing the area of each capacitor.

Also, it is easy to detect the etch end-point during the etching process for forming the cylindrical electrode, so that process stability can be secured and the height of the cylindrical electrodes is easily controlled. Besides, since the number of cylindrical electrodes is easily increased by repeating the process of forming the cylindrical electrodes, the cell capacitance required for a highly integrated semiconductor memory device of 256 Mb or higher capacity is easily secured.

Also, the tops of the cylindrical electrodes do not have a sharp portion, so that the reliability of the capacitors as well as the electrical characteristics are enhanced since the need for heat treatment is reduced. Accordingly, a reliable highly integrated semiconductor memory device can be achieved.

It will be understood by those skilled in the art from the foregoing description of a preferred embodiment of the disclosed device that various changes and modifications may be made in the invention without departing from the spirit and scope thereof.

What is claimed is:

1. A method for manufacturing a capacitor structure of an integrated semiconductor memory device comprising the steps of:

forming a sacrificial material layer on a semiconductor substrate;

forming a first conductive layer on said sacrificial material layer;

forming a resist layer and an oxide layer on said first conductive layer;

patterning said resist layer and said oxide layer to form a first pattern;

forming a first material layer on said first conductive layer;

etching said first material layer anisotropically to thereby form a spacer on sidewalls of said first pattern;

etching said first conductive layer using said spacer as an etch-mask and using said sacrificial material layer as an etch end-point;

removing said first pattern; then forming a second conductive layer on the resultant structure;

etching said second conductive layer anisotropically using said sacrificial material layer as said etch end-point; and removing said spacer together with said sacrificial layer to thereby form a storage electrode of a capacitor.

2. A method for manufacturing a capacitor structure of an integrated semiconductor memory device as claimed in claim 1, wherein a material, which has an etch rate different from an etch rate of material constituting said first conductive layer and said second conductive layer with respect to any anisotropic etching or isotropic etching process, is used as material constituting said sacrificial material layer and said first material layer.

3. A method for manufacturing a capacitor structure of an integrated semiconductor memory device as claimed in claim 2, wherein an oxide is used as said material constituting said sacrificial material layer and said first material layer, and a polysilicon is used as said material constituting said first conductive layer and said second conductive layer.

4. A method for manufacturing a capacitor structure of an integrated semiconductor memory device as claimed in claim 1, wherein a material constituting said resist layer has an etch rate different from an etch rate of material constituting said first conductive layer.

5. A method for manufacturing a capacitor structure of an integrated semiconductor memory device as claimed in claim 4, wherein said material constituting said resist layer is a photoresist.

6. A method for manufacturing a capacitor structure of an integrated semiconductor memory device as claimed in claim 1, wherein said first pattern is formed by a multi-layer resist lithographic process.

7. A method for manufacturing a capacitor structure of an integrated semiconductor memory device comprising the steps of:

forming a first conductive layer on a semiconductor substrate;

forming a first material layer and a second material layer sequentially on said first conductive layer;

patterning said second material layer to thereby form a first pattern;

forming a third material layer on the resultant structure whereon said first pattern is formed;

etching said third material layer anisotropically to thereby form a spacer on the side of said first pattern, and etching said first material layer simultaneously;

etching said first conductive layer using said spacer as an etch-mask;

removing said first pattern and said first material layer;

forming a second conductive layer on the resultant structure;

etching said second conductive layer anisotropically; and removing said spacer to thereby form a storage electrode of a capacitor.

8. A method for manufacturing a capacitor structure of an integrated semiconductor memory device as claimed in claim 7, wherein a material, which has a different etch rate from that of the material constituting said first and second conductive layers with respect to any anisotropic etching or isotropic etching process, is used as the material constituting said first and third material layers.

9. A method for manufacturing a capacitor structure of an integrated semiconductor memory device as claimed in claim 8, wherein an oxide is used as said material constituting said first and third material layers, and a polysilicon is used as said material constituting said first and second conductive layers.

10. A method for manufacturing a capacitor structure of an integrated semiconductor memory device as claimed in claim 7, wherein a material, which has a different etch rate from that of the material constituting said first material layer and the same or a similar etch rate as that of the material constituting said first conductive layer, is used as the material constituting said second material layer.

11. A method for manufacturing a capacitor structure of an integrated semiconductor memory device as claimed in claim 10, wherein a polysilicon is used as said material constituting said second material layer.

12. A method for manufacturing a capacitor structure of an integrated semiconductor memory device comprising the steps of:

forming a sacrificial material layer on a semiconductor substrate;

forming a first conductive layer on said sacrificial material layer;

forming a resist layer and an oxide layer on said first conductive layer;

patterning said resist layer and said oxide layer to form a first pattern;

forming a first material layer on said first conductive layer;

etching said first material layer anisotropically to thereby form a first spacer on sidewalls of said first pattern;

removing said first pattern; then forming a second conductive layer on the resultant structure;

etching said second conductive layer anisotropically to thereby form a first cylindrical electrode on the side of said first spacer;

forming a second material layer on the resultant structure whereon said first cylindrical electrode is formed;

etching said second material layer anisotropically to thereby form a second spacer on the side of said first cylindrical electrode;

forming a third conductive layer on the resultant structure whereon said second spacer is formed;

etching said third conductive layer and said first conductive layer anisotropically using said sacrificial material layer as an etch end-point to thereby form a second cylindrical electrode on the side of said second spacer; and removing said first and second spacers together with said sacrificial layer to thereby form a storage electrode of a capacitor.

13. A method for manufacturing a capacitor structure of an integrated semiconductor memory device as claimed in claim 12, wherein a material, which has an etch rate different from an etch rate of material constituting said second conductive layer and said third conductive layer and similar to an etch rate of material constituting said first material layer with respect to any anisotropic or isotropic etching process, is used as material constituting said sacrificial material layer and said second material layer.

14. A method for manufacturing a capacitor structure of an integrated semiconductor memory device as claimed in claim 13, wherein an oxide is used as said material constituting said sacrificial material layer and said second material layer, and a polysilicon is used as said material constituting said second conductive layer and said third conductive layer.

15. A method for manufacturing a capacitor structure of an integrated semiconductor memory device as claimed in claim 13, wherein said steps of etching said first material layer and etching said second material layer forming said first spacer and said second spacer, respectively, are repeated once more, to thereby form multiple cylindrical electrodes.

16. A method for manufacturing a capacitor structure of an integrated semiconductor memory device as claimed in claim 1, wherein said sacrificial material layer is an oxide.

17. A method for manufacturing a capacitor structure of an integrated semiconductor memory device as claimed in claim 1, wherein said sacrificial material layer is formed to a thickness of 500 to 2,000 Å.

18. A method for manufacturing a capacitor structure of an integrated semiconductor memory device as claimed in claim 1, wherein said method further comprises a step of forming an etch-blocking layer on said semiconductor substrate before said step of forming said sacrificial material layer.

19. A method for manufacturing a capacitor structure of an integrated semiconductor memory device as claimed in claim 12, wherein said sacrificial material layer is an oxide.

20. A method for manufacturing a capacitor structure of an integrated semiconductor memory device as claimed in claim 12, wherein said sacrificial material layer is formed to a thickness of 500 to 2,000 Å.

21. A method for manufacturing a capacitor structure of an integrated semiconductor memory device as claimed in claim 12, wherein said method further comprises a step of forming an etch-blocking layer on said semiconductor substrate before said step of forming said sacrificial material layer.

22. A method for manufacturing a capacitor structure of an integrated semiconductor memory device comprising the steps of:

forming a sacrificial material layer on a semiconductor substrate;

forming a first conductive layer on said sacrificial material layer;

forming a first material layer and a second material layer sequentially on said first conductive layer;

patterning said second material layer to thereby form a first pattern;

forming a third material layer on at least one of said first material layer and said conductive material layer;

etching said third material layer anisotropically to thereby form a spacer on the side of said first pattern, and etching said first material layer simultaneously;

etching said first conductive layer using said spacer as an etch-mask and using said sacrificial material layer as an etch end-point;

removing said first pattern and said first material layer; then forming a second conductive layer on the resultant structure;

etching said second conductive layer anisotropically using said sacrificial material layer as an etch end-point; and removing said spacer to thereby form a storage electrode of a capacitor.

23. A method for manufacturing a capacitor structure of an integrated semiconductor memory device as claimed in claim 7, wherein a material, which has a different etch rate from that of the material constituting said first and second conductive layers with respect to any anisotropic etching or isotropic etching process, is used as the material constituting said sacrificial material layer and said first and third material layers.

24. A method for manufacturing a capacitor structure of an integrated semiconductor memory device as claimed in claim 8, wherein an oxide is used as said material constituting said sacrificial material layer and said first and third material layers, and a polysilicon is used as said material constituting said first and second conductive layers.

25. A method for manufacturing a capacitor structure of an integrated semiconductor memory device as claimed in claim 7, wherein a material, which has a different etch rate from that of the material constituting said first material layer and the same or a similar etch rate as that of the material constituting said first conductive layer, is used as the material constituting said second material layer.

26. A method for manufacturing a capacitor structure of an integrated semiconductor memory device as claimed in claim 10, wherein a polysilicon is used as said material constituting said second material layer.

* * * * *